United States Patent
Orcutt

(10) Patent No.: US 6,194,786 B1
(45) Date of Patent: Feb. 27, 2001

(54) INTEGRATED CIRCUIT PACKAGE PROVIDING BOND WIRE CLEARANCE OVER INTERVENING CONDUCTIVE REGIONS

(75) Inventor: John W. Orcutt, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/153,745

(22) Filed: Sep. 15, 1998

Related U.S. Application Data

(60) Provisional application No. 60/059,539, filed on Sep. 19, 1997.

(51) Int. Cl.[7] ............ H01L 23/48; H01L 29/44; H05K 3/40
(52) U.S. Cl. ............ 257/780; 257/738; 257/737; 257/776; 257/690; 257/784
(58) Field of Search ................ 257/678, 786, 257/784, 696, 698, 776, 779, 780, 781, 772, 690, 691

(56) References Cited

U.S. PATENT DOCUMENTS

| | | | |
|---|---|---|---|
| 4,947,234 | * 8/1990 | Einzinger et al. | 257/500 |
| 4,984,065 | * 1/1991 | Sako . | |
| 5,045,151 | * 9/1991 | Edell | 156/647 |
| 5,101,263 | * 3/1992 | Kitano et al. | 257/734 |
| 5,359,227 | * 10/1994 | Liang et al. | 257/784 |
| 5,366,589 | * 11/1994 | Chang | 257/774 |
| 5,422,515 | * 6/1995 | Endo | 257/691 |
| 5,514,912 | * 5/1996 | Ogashiwa | 257/784 |
| 5,530,287 | * 6/1996 | Currie et al. | 257/692 |
| 5,578,869 | * 11/1996 | Hoffman et al. | 257/691 |
| 5,606,196 | * 2/1997 | Lee et al. | 257/503 |
| 5,686,699 | * 11/1997 | Chu et al. | 257/773 |
| 5,736,792 | * 4/1998 | Orcutt | 257/783 |
| 5,764,486 | * 6/1998 | Pendse | 361/774 |
| 5,808,354 | * 9/1998 | Lee et al. | 257/666 |
| 5,808,872 | * 9/1998 | Ozawa | 361/760 |
| 5,828,116 | * 10/1998 | Ao | 257/417 |
| 5,950,100 | * 9/1999 | Shingai | 438/617 |
| 5,973,397 | * 10/1999 | Low et al. | 257/698 |
| 5,976,964 | * 11/1999 | Ball | 438/613 |
| 6,001,724 | * 12/1999 | Stansbury | 438/617 |
| 6,034,440 | * 3/2000 | Ball | 257/786 |
| 6,098,283 | * 8/2000 | Goetsch et al. | 29/852 |

\* cited by examiner

*Primary Examiner*—Alexander O. Williams
(74) *Attorney, Agent, or Firm*—Wade James Brady III; Frederick J. Telecky, Jr.

(57) ABSTRACT

An integrated circuit in a package having a ground and/or power ring and bond wires crossing the ground and/or power ring, the bond wires further coupled to signal traces. A semiconductor integrated circuit is provided in a die cavity in a substrate. Signal traces are formed on the surface of the substrate. At least one conductive area is formed surrounding the die cavity. At least one signal trace is formed on the substrate and electrically isolated from the conductive ring. Bond wires are used to couple the die bond pads to the signal traces. At least some of the bond wires are coupled to signal traces and must cross the conductive ring. The bond wires are raised a clearance distance over the power or ground ring by forming a spacer on the inner end of the signal traces. The spacer formed on the signal trace then provides a clearance spacing to prevent the bond wires which cross the power ring from becoming shorted to the power ring. Typically, the spacer is formed as a bond wire ball placed on the signal trace. Typically the conductive ring is used as a ground ring, or as a voltage supply ring, for the integrated circuit. Multiple power or ground rings are used in some embodiments. Other devices and methods are described.

12 Claims, 3 Drawing Sheets

US 6,194,786 B1

INTEGRATED CIRCUIT PACKAGE PROVIDING BOND WIRE CLEARANCE OVER INTERVENING CONDUCTIVE REGIONS

This application claims priority under 35 USC § 119 (e) (1) of provisional application No. 60/059,539, filed Sep. 19, 1997.

FIELD OF THE INVENTION

This invention relates generally to the fabrication of integrated circuits utilizing wire bonding technology in conjunction with arrangements where the bond wires must cross other structures while maintaining clearance to these structures, and typically to the fabrication of integrated circuits having bond wires connected to conductive signal traces provided on a substrate. The signal traces map the interconnections to solder balls or other contact mechanisms formed on the substrate. Typically the integrated circuits are provided in ceramic or plastic packages. The solder balls or other contacts are formed on the substrate to provide a connection to the end users board or system.

BACKGROUND OF THE INVENTION

In producing integrated circuits, one preferred form of packaging is the ball grid array package, or BGA package. In a ball grid array package, an integrated circuit die is provided. Bond wires are used to couple the input and output pads of the integrated circuit die to a substrate. The substrate can be made of a variety of materials, such as ceramic, plastic, BT resin or so called "green board", fiberglass, tapes, insulating interposers, films, or other suitable insulating materials. The substrate supports traces of conducting material, usually copper or gold or conductive alloy traces that receive bond wires coupled to the integrated circuit bond pads. The traces then couple the signals from the bond wires to solder balls which are, in some BGA package types, formed on the opposite side of the substrate from the side which supports the integrated circuit die. Often throughhole or via type connections are used on the substrate to couple the traces on the integrated circuit side of the substrate to the solder balls formed on the opposite side. The solder balls are coupled to the signal traces on the substrate and provide electrical connections from the outside of the package to the integrated circuit. The cavity containing the integrated circuit is usually filled with a potting material, or alternatively overmolded in a molding press using conventional thermoset or thermoplastic mold compound or resin.

Alternatives to this arrangement are pin grid array or PGA packages, and other similar package types having bond wires coupling an integrated circuit to a substrate or other material. Solder balls are but one material choice for making a contact between the substrate and the end user's board or system, other arrangements may be used as well, such as a direct physical contact between a substrate and the end users board, conductive epoxy, conductive tape, solder dipped leads, etc.

In an improved package type, a "cavity down" package may be used. FIG. 1 depicts a cross sectional view of such a package. The substrate 11 has a cavity 12 on the bottom side. An integrated circuit die 17 is placed in the cavity upside down, so that the bottom of the integrated circuit die 17 is in physical contact with the substrate 11, and the bond pads of the die 17 are oriented pointing downwards towards the bottom of the finished package. Next, bond wires 19 are used to couple the input and output bonding pads of the integrated circuit 17 to conductive traces 20 of gold, aluminum, copper or other conductors which are formed on the bottom of the substrate 11. The signal traces 20 lead to ball receptacle pads (not visible) on the substrate 11, to which the solder balls 15 are attached. Potting material 23 is then used to cover the die cavity and thus protect the integrated circuit 17 and the bond wires 19 and the signal traces from contamination, particulates, and moisture.

The cavity down package of FIG. 1 has some advantages over the prior art packages described above. The use of throughhole connections is eliminated because the traces and the solder balls are physically placed on the bottom of the substrate. The substrate is in thermal contact with the bottom of the die, so that if a good thermal conductor is used for the substrate, the package provides excellent thermal performance. Heat sink or fins may be installed on the top of the package for more enhanced thermal performance. These are significant cost and performance advantages over other package types for integrated circuits.

A problem in producing a cavity down integrated circuit package is that the spacing available for the bond wires and the potting material is limited. The vertical distance (labeled "t" in FIG. 1) available underneath the package is limited by the diameter of the solder balls. The wires are routed from the bond pads of the integrated circuit to the signal traces on the substrate in such a manner that the wire loop height is placed well within the vertical area "t", the distance available when the solder balls are attached. This bond wire height requires a looping profile where the top of the loop can not be very high above the substrate surface, causing the wire to be almost parallel with, or at least very close to, the substrate surface.

It is desirable in packaging a high performance integrated circuit to provide conductive power and ground rings to simplify the substrate circuit, and to allow power and ground connections to the die to be added as needed without changing the substrate. This allows the use of different dies in the package without using a different substrate since there are connections for power and ground available all around the cavity. These power and ground rings are placed around the integrated circuit die between the integrated circuit die and the substrate signal traces as shown in FIG. 2 which is discussed in more detail hereinbelow. The power and ground rings then surround the integrated circuit on all sides. The bond wires have to travel over the rings to reach the substrate signal traces.

However, in packages that require the bonding wires to be almost parallel with the substrate surface, the power or ground rings as known in the prior art cannot be used, because the bond wires pass over and very close to the ground and power rings and can actually short circuit to the power or ground ring. This problem will arise, for example, in making pin grid array packages ("PGA") and ball grid array packages ("BGA") using the power and ground rings in the cavity down package of FIG. 1. Accordingly, a need thus exists for a method and apparatus which provides a reliable wire clearance for bond wires that would otherwise have clearance problems; and for a reliable integrated circuit wire interconnection in packages with ground and/or power rings that have clearance problems between the wire interconnections and the rings.

SUMMARY OF THE INVENTION

Generally, and in one form of the invention, a method and apparatus is provided for creating a slight clearance for bond wires which need to cross over conductive traces or other obstacles without physically or electrically contacting the obstacles. In an application of the invention, an integrated circuit is provided in a package with the cavity down, using bond wires almost parallel to the package substrate surface and having at least one wide power ring for providing power or ground voltages to the integrated circuit. A method and apparatus for subsequently forming a package for the completed integrated circuit is provided.

BRIEF DESCRIPTION OF THE DRAWINGS

In the drawings.

Corresponding numerals and symbols in the different figures refer to corresponding parts unless otherwise indicated in the specification and the figures.

DETAILED DESCRIPTION OF PREFERRED EMBODIMENTS

Figure 1:
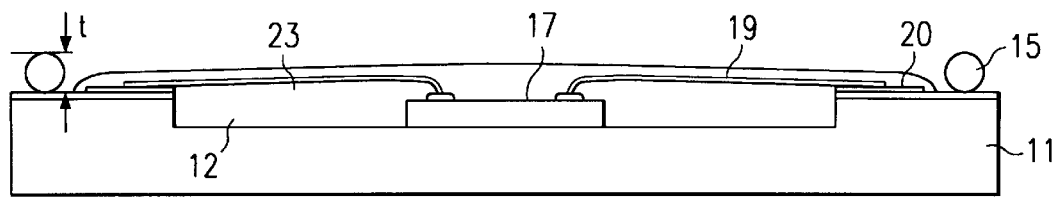
FIG. 1 depicts a cross sectional view of a prior art BGA package for an integrated circuit.
Figure 2:
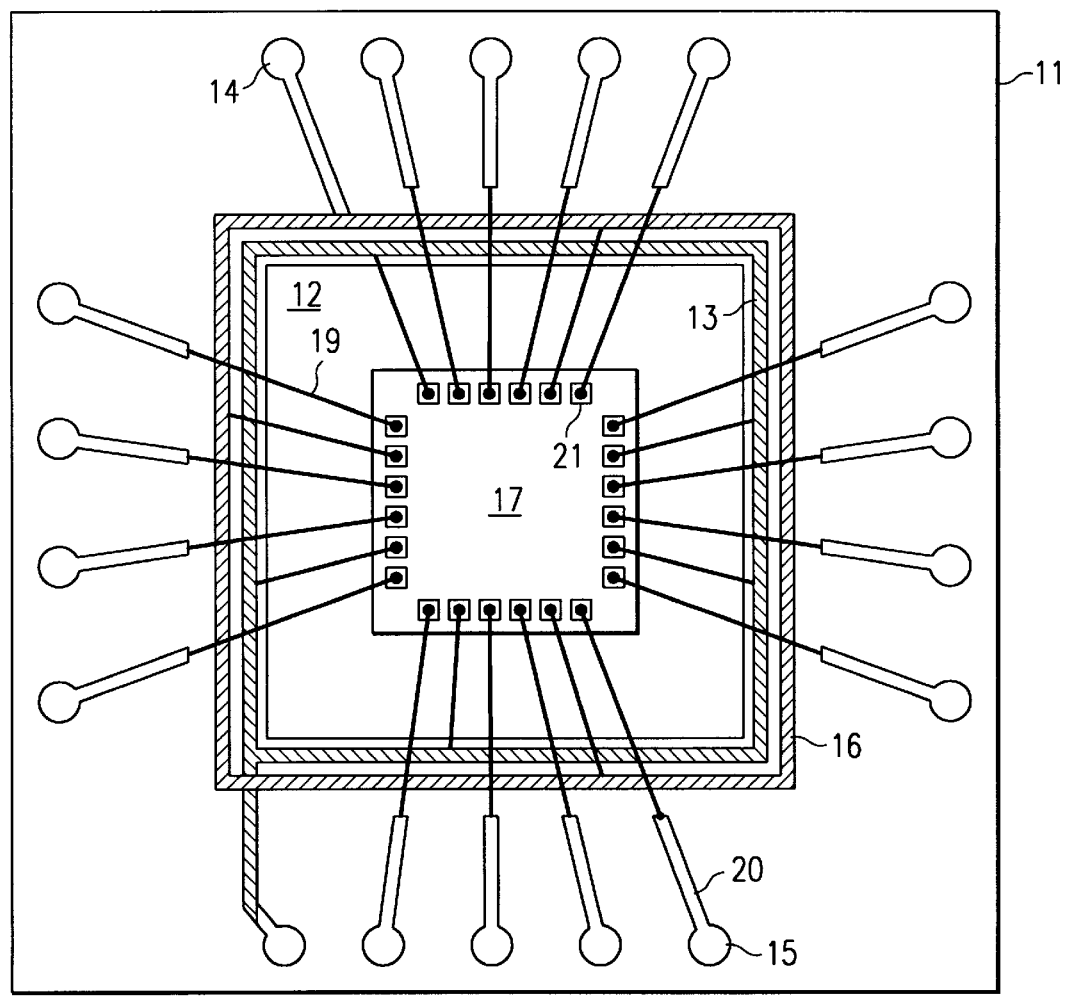
FIG. 2 depicts a bottom side view of a prior art cavity down package having a conductive ground and conductive power ring.

FIG. 2 depicts a bottom view of a prior art cavity down BGA integrated circuit package including a ground and power ring of the invention. In FIG. 2, substrate 11 is shown with a die cavity 12 formed within it. Ground and power rings 13 and 16 are formed of a conductor, typically a copper or copper alloy trace or a trace formed from another conventional conductor such as gold or gold alloys or other conductive alloys is formed on the surface of the substrate 11 and surrounding the die cavity 12. The ground ring 13 is figurer coupled to a solder ball 15 which is designated as a ground pin for the completed integrated circuit. This coupling can be performed by a bond wire, or preferably by using a trace on the substrate, however it must cross a second power ring 16 without shorting rings 16 and 13 together. Power ring 16 is provided surrounding ground ring 13, so that a supply and ground voltage ring may be used to power the integrated circuit. Power ring 16 is coupled to a solder ball 14 which is designated as the power pin for the packaged integrated circuit using another trace formed on substrate 11. Additional power and ground rings may be provided, for example, to lower resistance and eliminate noise by isolating switching circuitry power supplies from other power supplies as is known in the integrated circuit art. Also, some integrated circuits require multiple power supplies or ground supplies at different voltages, such as certain memory or DRAM devices. The invention disclosed herein uses at least one, and as many as necessary, power rings surrounding the die cavity.

Integrated circuit die 17 is placed within the die cavity 12 and mounted to the substrate using die attach epoxy, a thermally conductive tape, or other conventional integrated circuit die attach technology. Bond pads 21 on the integrated circuit die 17 are coupled to the signal traces 20 on the substrate 11 by bond wires 19. The bond wires 19 are comprised of gold, aluminum, silver, or other conductive alloys such as silver/gold, and are attached to the bond pads using conventional ball bonding techniques, that is the wire bonding station places a ball on the bond pad which is attached electrically and physically to the bond pads 21. The bond wires 19 couple each bond pad to a signal trace 20 on the substrate. The bond wires are attached to the signal traces using a stitch bond or other conventional bond for bond wires. The bond wires 19 have to cross and remain electrically isolated from the ground ring 13 and power ring 16, except for bond wires which are intentionally bonded to either ring.

The integrated circuit die may have any one of a number of functions, including a memory device such as a DRAM, SRAM, EPROM, Synchronous DRAM, or other memory, a digital signal processor (DSP), a microprocessor, or a user specified function such as is found in ASICs, semicustom IC's, programmable gate arrays and other programmable or custom integrated circuits.

Figure 3:
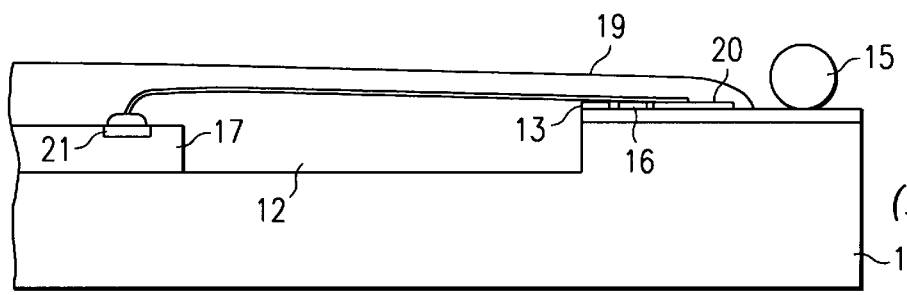
FIG. 3 depicts a cross sectional view of a non preferred embodiment depicting the problem addressed by the invention described in this application.

FIG. 3 depicts a cross sectional view of an embodiment, not preferred, which is illustrative of the results obtained in manufacturing the cavity down package of FIG. 2 using conventionally known wire bonding techniques. In FIG. 3, substrate 11 is shown with a die cavity 12 formed within it. Integrated circuit die 17 is placed within the cavity and attached using die attach epoxy or tape. Bond pad 21 is shown with bond wire 19 attached to the bond pad using a ball type wire bond. Bond wire 19 is coupled across ground and power rings 13 and 16 to signal trace 20. Solder ball 15 is attached to substrate 11 and electrically and physically coupled to signal trace 20.

The non preferred arrangement of FIG. 3 is used to depict the problem addressed by the inventions disclosed herein. In FIG. 3, the bond wire 19 is shown crossing the ground and power ring 13 and 16. It can be appreciated that the vertical clearance available between bond wire 19 and the ground and power rings 13 and 16 is not sufficient. An integrated circuit package manufactured having this arrangement will exhibit undesired electrical shorts between bond wires 19 and one of the power rings due to the lack of proper clearance between the bond wires and the power rings.

Figure 4:
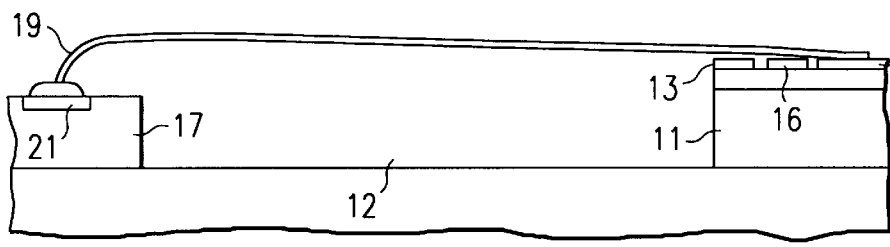
FIG. 4 depicts a close up view of the cross section of the non preferred embodiment of FIG. 3.

FIG. 4 is a close up view of a portion of the cross sectional view of FIG. 3 with the ball 15 omitted, though it can be part of the package and further illustrates the problem depicted in FIG. 3. Again, bond wire 19 crosses ground ring 13 and power ring 16 (in this example, although other examples, such as a single ground ring, are also contemplated) to couple the signal trace 20 formed on substrate 11 to the bond pad of integrated circuit 21. It can be appreciated that the bond wire 19 is too close to the ground and power rings 13 and 16 to provide adequate clearance to prevent unintentional connection and electrical shortage between bond wires 19 and the power rings. Also, even if actual contact is not made, cross talk may occur between the bond wires and the power rings, because the distance is so small between them.

It should be noted that in other conventional packages, the arrangement of FIG. 4 would exhibit similar problems. For example, in a pin grid array package using wire bonding to couple a IC to the substrate, and using the power and ground rings as shown in FIGS. 2, 3 and 4, the bond wires would also have to cross the power and ground rings and thus the possibility of a shorting problem would arise. The invention described herein is applicable to BGA, PGA and other packaging arrangements where bond wires must cross power and ground signals, or other structures, without contacting them, that is, wherever a bond wire clearance problem arises.

Figure 5:
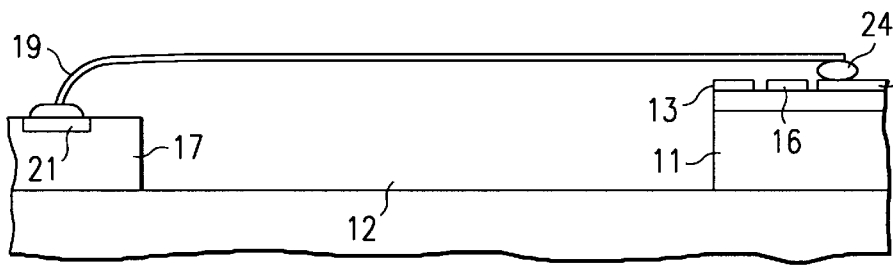
FIG. 5 depicts a close up cross sectional view of a package formed using the apparatus and method of the invention described herein.

FIG. 5 is a cross sectional view of a preferred embodiment of the package depicted as a bottom view in FIG. 2, using the method and apparatus of the invention. In FIG. 5, substrate 11 is depicted in a partial cross section with die cavity 12 containing integrated circuit die 17. Balls 15, as shown in FIG. 3 can be included though they are not shown Bond wire 19 couples bond pad 21 to signal trace 20. Bond wire 19 has a ball type wire bond at die pad 21. Bond wire 19 is routed across power rings 13 and 16 and is then stitch bonded to ball bond 24, which has previously been placed on or near the innermost end of signal trace 20. Ball bond 24 is made using a conventional ball bonding technique to make the ball, then skipping the normal looping and stitch bond sequences, going directly to wire break which would then occur above the ball, so that a ball is left on the inner end of signal trace 20. This operation is performed prior to the wire bonding of the bond pads 21 to the signal traces 20. The wire bonding operation can be performed in any of several ways, including first forming the ball bonds 24 on each signal trace 20 of the substrate, then using a ball and stitch connection to couple each die pad 21 to the associated signal trace 20 by placing the ball wire bond on the die pad 21 and then forming a stitch wire bond on top of the ball bond 24. Alternatively, a conventional wire bonder may be set up to form each connection in series, by first forming the ball bond on the particular signal trace 20, then moving to the associated bond pad 21 and forming a second ball bond, pulling the bond wire 19 to the signal trace 20 and placing a stitch bond on top of ball 24. The advantage of this arrangement is that the clearance between the bond wires 19 that cross the power rings 13 and 16 is now increased by the height of the ball bond 24. This distance increase eliminates the potential for shorting between the bond wire 19 and the power rings 13 and 16.

The example of the invention shown in FIG. 5 depicts two rings, 13 and 16, surrounding the die cavity. In a simpler example, perhaps only one ring would be used. Also, in the case of a bond pad that needs to be coupled to the power ring, 16, in the two ring example of FIG. 5, a spacer bond wire ball will be necessary between the bond wire and the power ring 16 to create the clearance needed to cross the ground ring 13. Additional rings could be used, in which case any bond wire that must cross any number of the rings would have the spacer bond ball of the invention placed between it and the ring or signal trace it couples to.

Figure 6:
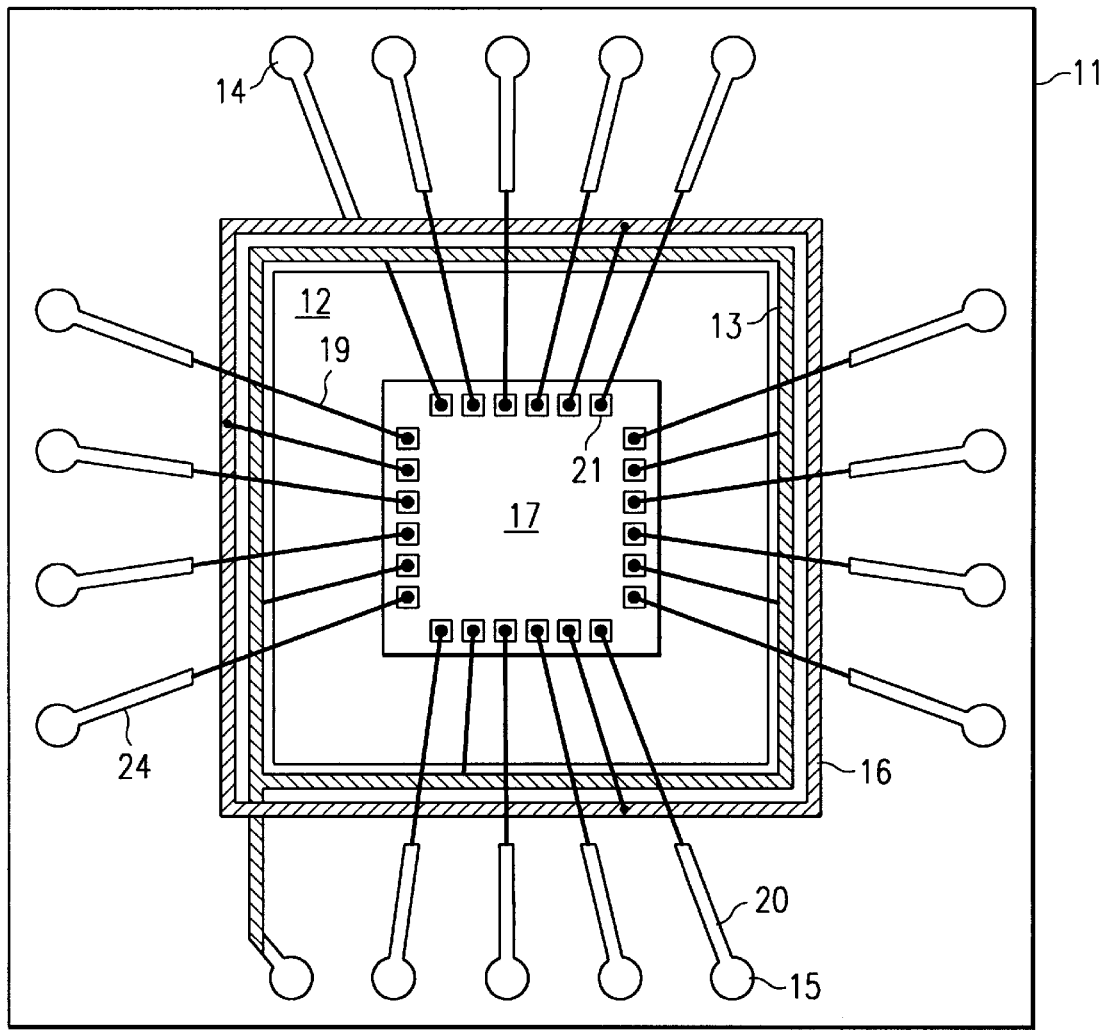
FIG. 6 as a view as in FIG. 2 additionally showing a preferred embodiment of the invention.

Referring to FIG. 6, there is shown a view as in FIG. 2 except that the balls 24 have been formed on the portion of the signal trace 20 dose to the two rings 13 and 16 to provide elevation of the wires 19 in the vicinity of the two rings as shown in FIG. 5. The balls 24 preferably have a height equal to the otherwise highest point on the underside of the substrate, though this height is not critical and can be greater or less than the otherwise highest point. It is clear that the higher the balls 24, the less likelihood there is for the wires 19 to sag toward the two rings 13 and 16. However, the height of the balls 24 can also affect the ultimate thickness of the package. Accordingly, there is generally a tradeoff between the height of the balls and consideration of ultimate package thickness. The wires 19 are connected to the balls 24 preferably by a stitch bond.

The method and apparatus of the invention may be used to create a clearance tolerance wherever a bond wire must cross another structure without contacting it. Examples include a PGA package with power and ground rings, or other bonded package types where the bond wires cross substrate traces or other materials that the bond wires should not contact.

Figure 7:
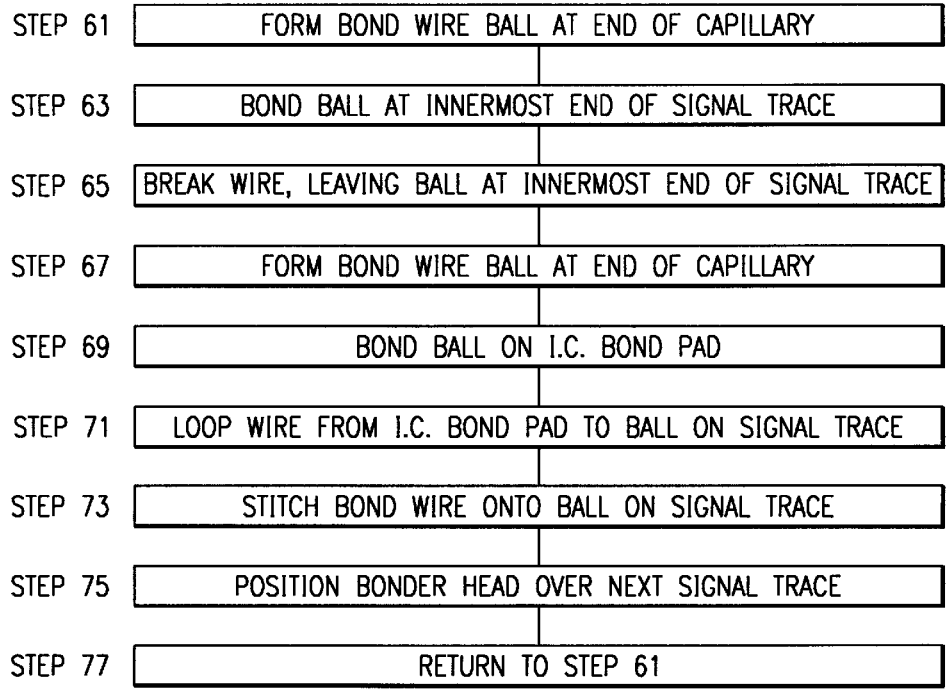
FIG. 7 depicts one possible series of steps used to form the wire bonds for the package depicted in FIG. 5.

FIG. 7 depicts the bonding steps required to make the preferred embodiment of FIG. 5 in one preferred method. A practitioner skilled in the art will recognize that wire bonders may perform the required operations in several different orders, each of which is contemplated within the scope of the invention and preferred embodiments disclosed within. The method depicted in FIG. 6 illustrates one exemplary series of steps to be used in manufacturing the BGA package of the invention, but is not to be construed as limiting the scope of the invention to this particular order of steps.

In FIG. 7, a wire bonder bond head receives bond wire from a continuos supply of bond wire. In step 61, a conventional "flame off" technique is used for forming a ball bond at the end of the wire on the bonder head as is known in the wire bonding art. In step 63, the bonder head places the ball bond at the innermost end of a signal trace 20. In step 65, the bond wire is pulled from the ball as is known in the bonding art. This leaves the ball bond 24 on the end of signal trace 20. Step 67 us a repeat of step 61, using a conventional "flame off" technique to make a ball at the end of the bond wire.

In step 69 the bonder head approaches the associated bond pad 21 from above. The end of the bond wire is again a ball shape. In step 69, this ball is placed on the bond pad. Conventional techniques for bonding to the bond pad, including the use of ultrasonic energy, vibration and pressure to improve the physical and electrical bond to the bond pad are used to achieve a reliable wire bond. In step 71, the bond head moves away from the bond pad 21, but this time the wire is not severed but remains coupled bond pad 21. The bond wire 19 is then extended away from bond pad 21.

In step 73 the bond head approaches previously formed and deposited ball bond 24 extending the bond wire 19 from bond pad 21. The bond wire is stretched across the die cavity and across the power rings 13 and 16. The wire bonder then forms a stitch type wire bond on the ball 24. Finally, in step 77, the wire bond is completed when a stitch wire bond is used to place the end of bond wire 19 on the ball bond 25 and the wire is severed. A flame off is used to form another ball for the next ball bond operation. The bonder head is then positioned over the next signal trace on the substrate. Step 77 shows the repeat operation step for the process. The steps of FIG. 6 are then repeated for each bond pad and signal trace in the package. A low looping wire bond wire is extended from each bond pad to a signal trace and routed across the power rings for each signal.

The steps described in FIG. 7 are but one possible sequence which could be used to accomplish the apparatus of FIG. 5. An alternative would be to form all of the bond wire balls on the innermost ends of the signal traces of substrate 11, and then to bond the IC bond pads to the associated bond wire balls in sequence.

In addition to a ground ring, it may be desirable to provide additional rings for additional supply voltages such as Vdd. These rings will also surround the cavity and can be made inside or outside the ground ring. These will also be coupled by bond wires to more than one bond pad on a typical IC. If these rings lie outside a first ground ring, then a clearance issue will exist card a bond wire ball should be provided prior to bonding the power ring to the bond pads of the IC, so that the wire can cross the inner ring without a shorting or clearance problem. The method disclosed above in FIG. 7 is preferably used to perform this step.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A package for an integrated circuit comprising:
   (a) a substrate having a top and an opposing bottom surface;
   (b) a die cavity disposed in one of said surfaces of said substrate for receiving an integrated circuit die, the integrated circuit die having a bond pad thereon;
   (c) a signal trace disposed on said one of said surfaces of said substrate;
   (d) at least one electrically conductive area on said one of said surfaces of said substrate electrically isolated from said signal trace;
   (e) a separate electrically conductive spacer disposed on, secured to and extending above said signal trace; and
   (f) a bond wire connection between said bond pad on said integrated circuit die and said spacer, said bond wire crossing over said electrically conductive area while being electrically isolated from said electrically conductive area.

2. The package of claim 1 wherein said spacer comprises a ball disposed on said signal trace.

3. The package of claim 2 wherein said ball is a ball bond to said signal trace.

4. The package of claim 1 wherein said bond wire connection to said spacer is a stitch bond.

5. The package of claim 2 wherein said bond wire connection to said spacer is a stitch bond.

6. The package of claim 2 wherein said bond wire connection to said spacer is a stitch bond.

7. The package of claim 1 wherein each of said traces has an innermost end extending toward said die cavity and an outermost end, said spacer disposed on and extending above the innermost end of a said signal trace.

8. The package of claim 2 wherein each of said traces has an innermost end extending toward said die cavity and an outermost end, said spacer disposed on and extending above the innermost end of a said signal trace.

9. The package of claim 3 wherein said trace has an innermost end extending toward said die cavity and an outermost end, said spacer disposed on and extending above the inner most end of a said signal trace.

10. The package of claim 4 wherein said trace has an innermost end extending toward said die cavity and an outermost end, said spacer disposed on and extending above the inner most end of a said signal trace.

11. The package of claim 5 wherein said trace has an innermost end extending toward said die cavity and an outermost end, said spacer disposed on and extending above the inner most end of a said signal trace.

12. The package of claim 6 wherein said trace has an innermost end extending toward said die cavity and an outermost end, said spacer disposed on and extending above the inner most end of a said signal trace.

\* \* \* \* \*